(12) United States Patent
Lim

(10) Patent No.: US 8,766,308 B2
(45) Date of Patent: Jul. 1, 2014

(54) SEMICONDUCTOR LIGHT-EMITTING DEVICE

(71) Applicant: Woo Sik Lim, Seoul (KR)

(72) Inventor: Woo Sik Lim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/963,724

(22) Filed: Aug. 9, 2013

(65) Prior Publication Data

US 2013/0320389 A1 Dec. 5, 2013

Related U.S. Application Data

(63) Continuation of application No. 12/992,950, filed as application No. PCT/KR2009/002596 on May 15, 2009, now Pat. No. 8,530,919.

(30) Foreign Application Priority Data

May 16, 2008 (KR) .................. 10-2008-0045740

(51) Int. Cl.
*H01L 33/60* (2010.01)
(52) U.S. Cl.
USPC .............. 257/98; 257/79; 257/99; 257/100; 257/103; 257/E33.068
(58) Field of Classification Search
USPC ......... 257/9–39, E29.069–E29.071, E29.245, 257/E49.001–E49.004
See application file for complete search history.

(56) References Cited

U.S. PATENT DOCUMENTS

| 6,891,871 B1 | 5/2005 | Nomura et al. |
| 6,900,069 B2 | 5/2005 | Kaneko et al. |
| 2003/0141506 A1 | 7/2003 | Sano et al. |
| 2006/0065901 A1 | 3/2006 | Aoyagi et al. |
| 2006/0261323 A1 | 11/2006 | Suh et al. |
| 2008/0006836 A1 | 1/2008 | Lee |
| 2008/0048206 A1 | 2/2008 | Lee et al. |
| 2009/0028202 A1 | 1/2009 | Jeong |
| 2009/0294784 A1 | 12/2009 | Nakahara et al. |
| 2010/0237371 A1 | 9/2010 | Kang et al. |

FOREIGN PATENT DOCUMENTS

| CN | 1383220 A | 4/2002 |
| CN | 1848564 A | 10/2006 |
| CN | 101084583 | 12/2007 |
| CN | 101442096 A | 5/2009 |
| EP | 2 219 238 | 8/2010 |
| EP | 2 257 997 | 12/2010 |
| KR | 10-2006-0035424 | 4/2006 |
| KR | 10-2007-0015709 | 2/2007 |
| WO | WO 2006/043796 | 4/2006 |
| WO | WO 2007/055202 | 5/2007 |
| WO | WO 2009/045082 | 4/2009 |

(Continued)

OTHER PUBLICATIONS

Cover sheet for Chinese Patent Publication No. CN 102027606 B dated Apr. 24, 2013.

(Continued)

*Primary Examiner* — Mamadou Diallo
(74) *Attorney, Agent, or Firm* — KED & Associates LLP

(57) ABSTRACT

Disclosed is a semiconductor light emitting device. The semiconductor light emitting device includes a first conductive semiconductor layer, an active layer under the first conductive semiconductor layer, a second conductive semiconductor layer under the active layer, a second electrode layer under the second conductive semiconductor layer; and an insulating layer on an outer peripheral surface of at least two layers of the first conductive semiconductor layer, the active layer, and the second conductive semiconductor layer.

20 Claims, 7 Drawing Sheets

(56) References Cited

FOREIGN PATENT DOCUMENTS

WO    WO 2009/117845    10/2009

OTHER PUBLICATIONS

International Search Report dated Dec. 18, 2009 issued in Application No. PCT/KR2009/002596.
Chinese Office Action dated May 4, 2012.
European Search Report dated Sep. 6, 2012.
United States Office Action date Oct. 24, 2012 issued in U.S. Appl. No. 12/992,950.
United States Office Final Action date Mar. 22, 2013 issued in U.S. Appl. No. 12/992,950.
European Office Action dated Apr. 15, 2014.
Korean Office Action dated Mar. 27, 2014.

SEMICONDUCTOR LIGHT-EMITTING DEVICE

CROSS-REFERENCE TO RELATED APPLICATIONS

This application is a Continuation Application of prior U.S. patent application Ser. No. 12/992,950 filed Nov. 16, 2010, which claims priority under 35 U.S.C. §119 to Korean Patent Application No. 10-2008-0045740 filed on May 16, 2008, whose entire disclosures are hereby incorporated by reference.

BACKGROUND

1. Field

The embodiment relates to a semiconductor light emitting device.

2. Background

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of an illumination device or a display device. Particularly, a light emitting device including the group III nitride semiconductor has a direct fundamental band gap corresponding to a visible ray band to an ultra-violet band so that high light emission efficiency can be realized.

The nitride semiconductor is mainly used for the LED (Light Emitting Diode) or an LD (laser diode), and studies have been continuously conducted to improve the manufacturing process or a light efficiency of the nitride semiconductor.

The above references are incorporated by reference herein where appropriate for appropriate teachings of additional or alternative details, features and/or technical background.

DISCLOSURE

Technical Problem

The embodiment provides a semiconductor light emitting device including an insulating layer formed on an outer peripheral surface of a plurality of conductive semiconductor layers.

The embodiment provides a semiconductor light emitting device in which a second electrode layer is provided under a light emitting structure, and an insulating layer is provided on outer peripheral surface of at least one of semiconductor layers of the light emitting structure.

The embodiment provides a semiconductor light emitting device in which an insulating layer is provided on an outer peripheral surface of a light emitting structure and a passivation layer is provided on an outer peripheral surface of a top surface of the second electrode layer.

Technical Solution

According to the embodiment, a semiconductor light emitting device includes a first conductive semiconductor layer, an active layer under the first conductive semiconductor layer, a second conductive semiconductor layer under the active layer, a second electrode layer under the second conductive semiconductor layer; and an insulating layer on an outer peripheral surface of at least two layers of the first conductive semiconductor layer, the active layer, and the second conductive semiconductor layer.

According to the embodiment, a semiconductor light emitting device includes a light emitting structure including a first conductive semiconductor layer, an active layer under the first conductive semiconductor layer, and a second conductive semiconductor layer under the active layer, a first electrode on the first conductive semiconductor layer, a second electrode layer under the second conductive semiconductor layer, and an insulating layer on an outer peripheral surface of both of the active layer and the second conductive semiconductor layer.

Advantageous Effects

According to the embodiment, current can be prevented from leaking out of the light emitting structure.

According to the embodiment, the adhesion strength with the second electrode layer can be improved by using the insulating layer.

According to the embodiment, an additional photolithography process for the second electrode layer can be removed, so that the manufacturing process can be simplified.

According to the embodiment, the electrical reliability for the semiconductor light emitting device can be improved.

BRIEF DESCRIPTION OF THE DRAWINGS

The embodiments will be described in detail with reference to the following drawings in which like reference numerals refer to like elements wherein.

DETAILED DESCRIPTION

Mode for Invention

Figure 1:
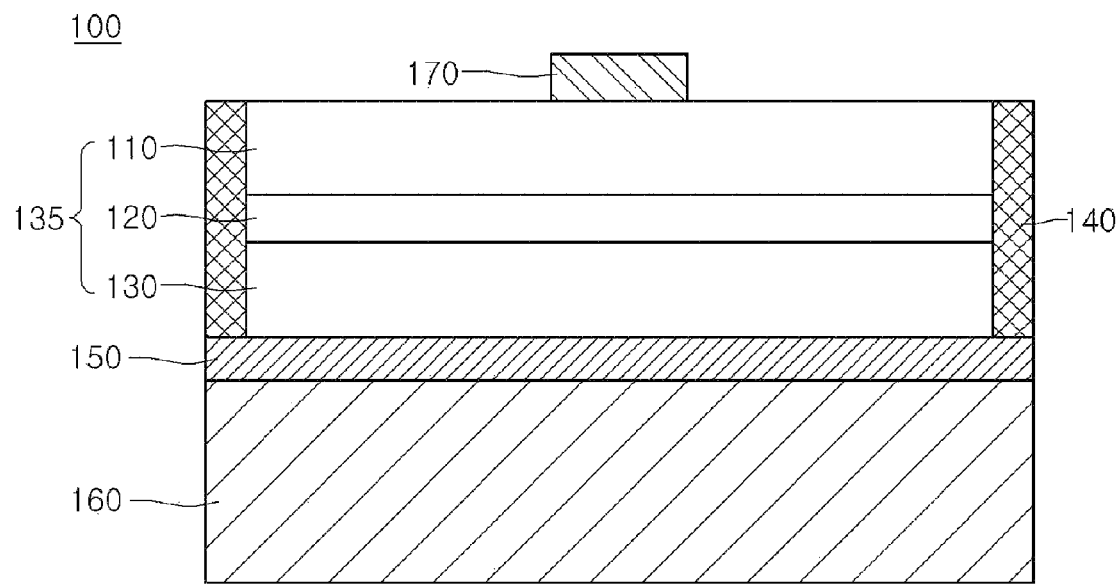
FIG. 1 is a side sectional view showing a semiconductor light emitting device according to a first embodiment.

Hereinafter, a semiconductor light emitting device according to the embodiments will be described in detail with reference to accompanying drawings. In the following description, the thickness and size of each layer shown in the drawings can be exaggerated, omitted or schematically drawn for the purpose of convenience or clarity. In addition, the top or the bottom of each layer will be determined on the basis of the drawings.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

FIG. 1 is a side sectional view showing a semiconductor light emitting device according to a first embodiment.

Referring to FIG. 1, the semiconductor light emitting device 100 includes a first conductive semiconductor layer 110, an active layer 120, a second conductive semiconductor layer 130, an insulating layer 140, a second electrode 150, and a conductive support member 160.

The semiconductor light emitting device 100 includes LEDs made of group III-V compound semiconductors, and the LEDs may include color LEDs to emit blue, green or red light, or UV LEDs. The emission light of the LEDs may be variously realized within the technical scope of the embodiment.

The first conductive semiconductor layer 110 may include compound semiconductors of group III-V elements doped with first conductive dopants. For instance, the first conductive semiconductor layer 110 may be selected from the group consisting of GaN, AlN, AlGaN, InGaN, InN, InAlGaN, AlInN, AlGaAs, GaP, GaAs, GaAsP, and AlGaInP.

If the first conductive semiconductor layer 110 includes an N type semiconductor layer, the first conductive dopant may include an N type dopant such as Si, Ge, Sn, Se, or Te. The first conductive semiconductor layer 110 may serve as an electrode contact layer, and may have a single-layer structure or a multi-layer structure, but the embodiment is not limited thereto.

A first electrode 170 is formed on the first conductive semiconductor layer 110, and the first electrode 170 supplies power having first polarity. A roughness (not shown) having a predetermined shape may be formed on a top surface of the first conductive semiconductor layer 110, and the roughness may be additionally provided or modified within the technical scope of the embodiment.

In addition, a transmissive electrode layer (not shown) may be formed on the first conductive semiconductor layer 110, and spreads the power having the first polarity, which has been supplied by the first electrode 170, onto the whole region. The transmissive electrode layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO.

The active layer 120 is formed under the first conductive semiconductor layer 110, and may have a single quantum well structure or a multiple quantum well structure. The active layer 120 may have a stack structure including a well layer and a barrier layer, which are made from group III-V compound semiconductor material. For instance, the active layer 120 may have a stack structure of InGaN well/GaN barrier layers.

The active layer 120 is made of material having band gap energy according to wavelengths of light to be emitted. The active layer 120 may include material capable of providing color light such as blue light, red light, or green light, but the embodiment is not limited thereto. A conductive clad layer may be formed on and/or under the active layer 120. The conductive clad layer may include an AlGaN layer.

The second conductive semiconductor layer 130 is provided under the active layer 120. The second conductive semiconductor layer 130 may include compound semiconductors of group III-V elements doped with the second conductive dopant. For instance, the second conductive layer 130 may be selected from the group consisting of GaN, AlN, AlGaN, InGaN, InN, InAlGaN, AlInN, AlGaAs, GaP, GaAs, GaAsP, and AlGaInP. If the second conductive semiconductor layer 130 is a P type semiconductor layer, the second conductive dopant includes a P type dopant such as Mg or Ze. The second conductive semiconductor layer 130 may serve as an electrode contact layer, and may have a single-layer structure or a multi-layer structure, but the embodiment is not limited thereto.

The first conductive semiconductor layer 110, the active layer 120, and the second conductive semiconductor layer 130 may be defined as a light emitting structure 135. The first conductive semiconductor layer 110 may include a P type semiconductor, and the second conductive semiconductor layer 130 may include an N type semiconductor. A third conductive semiconductor layer such as an N type semiconductor layer or a P type semiconductor layer may be formed under the second conductive semiconductor layer 130. Accordingly, the light emitting structure 135 may include at least one of an N-P junction structure, a P-N junction structure, an N-P-N junction structure and a P-N-P junction structure.

The insulating layer 140 is formed on an outer peripheral surface of the light emitting structure 135. The insulating layer 140 serves as a sidewall on the outer peripheral surface of the second conductive semiconductor layer 130, the active layer 120, and the first conductive semiconductor layer 110. The insulating layer 140 may be formed in the shape of a band or a ring.

The insulating layer 140 may include insulating material such as SiO2, Si3N4, Al2O3, or TiO2, but the embodiment is not limited thereto.

The insulating layer 140 may be formed as a sidewall on an outer peripheral surface of at least one semiconductor layer. For instance, the insulating layer 140 may be formed on an outer peripheral surface of the active layer 120 or both the second conductive semiconductor layer 130 and the active layer 120.

In addition, an upper end of the insulating layer 140 may extend to a lower portion of the first conductive semiconductor layer 110. A lower end of the insulating layer 140 may extend downward beyond the second conductive semiconductor layer 130.

The insulating layer 140 may have a thickness less than or equal to that of the light emitting structure 135, or may have a thickness greater than or equal to that of the light emitting structure 135.

The second electrode layer 150 may be formed under the second conductive semiconductor layer 130, or may extend to a lower portion of the insulating layer 140.

The second electrode layer 150 may include Ag, Ni, Al, Rh, Pd, Ir, Ru, Mg, Zn, Pt, Au, Hf, or the combination thereof. The second electrode layer 150 may include reflective electrode material having 50% or more of a reflective rate.

An ohmic contact layer (not shown) having a plurality of patterns arranged in the form of a matrix and/or a layer may be interposed between the second electrode layer 150 and the second conductive semiconductor layer 130. The ohmic contact layer includes at least one selected from the group consisting of ITO, IZO, AZO, IZTO, IAZO, IGZO, IGTO, and ATO.

The second electrode layer 150 may make schottky contact with the second conductive semiconductor layer 130 or make ohmic contact with the second conductive semiconductor layer 130. If an ohmic contact layer having a pattern exists between the second electrode layer 150 and the second conductive semiconductor layer 130, the second electrode layer 150 may make schottky contact with the second conductive semiconductor layer 130, and the ohmic contact layer makes ohmic contact with the second conductive semiconductor layer 130. Accordingly, since the second electrode layer 150 has an electric characteristic different from that of the ohmic contact layer, current supplied to the second conductive semiconductor layer 130 can be diffused.

The second electrode layer 150 stably supplies power having the second polarity to the light emitting structure 135, and reflects light incident through the second conductive semiconductor layer 130.

The conductive support member 160 is formed under the second electrode layer 150. The second conductive support member 160 may be realized by using Cu, Au, Ni, Mo, Cu—W, and carrier wafers such as Si, Ge, GaAs, ZnO, and SiC. The conductive support member 160 may be formed through an electroplating process, but the embodiment is not limited thereto.

The second electrode layer 150 and the conductive support member 160 may be used as a second electrode part to supply power having the second polarity to the light emitting structure 135. The second electrode part may include electrode material in a single-layer structure or a multiple-layer structure, or may be bonded to a lower portion of the second conductive semiconductor layer 130 by using an adhesive agent.

In the semiconductor light emitting device 100, the insulating layer 140 is provided at an outer portion of the light emitting structure 135, thereby preventing residual materials or external moisture from infiltrating into an outer portion of the light emitting structure 135. Accordingly, electrical short among the semiconductor layers 110, 120, and 130 can be prevented from occurring at the outer portion of the semiconductor light emitting device 100.

The insulating layer 140 is provided at an outer portion of the light emitting structure 135, thereby preventing current from leaking out of the light emitting structure 135. For instance, current applied through the second electrode layer 150 has tendency to be directed to the outside of the light emitting structure 135. However, such current is shut off by the insulating layer 140, so that current injection efficiency can be improved.

The insulating layer 140 is provided at outer portions of the second electrode layer 150 and the second conductive semiconductor layer 130, so that the adhesion strength of the second electrode layer 150 can be improved.

FIGS. 2 to 9 are sectional views showing the manufacturing process of the semiconductor light emitting device according to the first embodiment.

Figure 2:
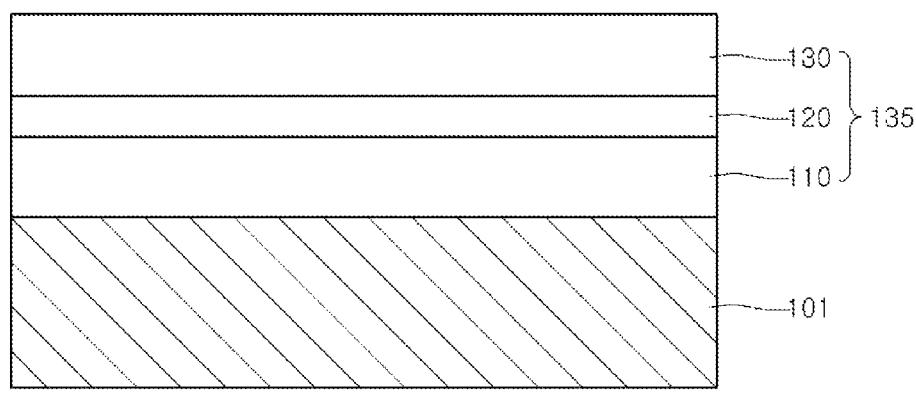
FIGS. 2 to 9 are side sectional views showing the manufacturing process of the semiconductor light emitting device according to the first embodiment of FIG. 1.

Referring to FIG. 2, the first conductive semiconductor layer 110 is formed on a substrate 101, and the active layer 120 is formed on the first conductive semiconductor layer 110. The second conducive semiconductor layer 130 is formed on the active layer 120.

The substrate 101 may be selected from the group consisting of a sapphire substrate (Al2O3), GaN, SiC, ZnO, Si, GaP, InP, Ga2O3, and GaAs. A concave-convex pattern may be formed on the surface of the substrate 101, but the embodiment is not limited thereto.

A group III-V compound semiconductor may be grown on the substrate 101, and growth equipment may be selected from the group consisting of an E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited thereto.

A buffer layer (not shown) and/or an undoped semiconductor layer (not shown) may be formed between the substrate 101 and the first conductive semiconductor layer 110 by using a compound semiconductor of group III-V elements, and may be separated or removed from the substrate 101 after a thin film has been grown. The buffer layer can reduce a lattice constant mismatch with respect to the substrate 101, and the undoped semiconductor layer may be a base to grow a compound semiconductor layer.

The first conductive semiconductor layer 110 may include a compound semiconductor of group III-V elements doped with the first conductive dopant. For example, the first conductive semiconductor layer 110 may be selected from the group consisting of GaN, AlN, AlGaN, InGaN, InN, InAlGaN, AlInN, AlGaAs, GaP, GaAs, GaAsP, and AlGaInP. If the first conductive semiconductor layer 110 is an N-type semiconductor layer, the first conductive dopant includes an N type dopant such as Si, Ge, Sn, Se, or Te. The first conductive semiconductor layer 110 may serve as an electrode contact layer, and may have a single-layer structure or a multiple-layer structure. However, the embodiment is not limited thereto.

The active layer 120 may have a single quantum well structure or a multiple quantum well structure. The active layer 120 may have a stack structure including well and barrier layers which are made of a compound semiconductor of group III-V elements. For instance, the active layer 120 may have a stack structure of InGaN well/GaN barrier layers. A conductive clad layer may be formed on and/or under the active layer 120, and may include an AlGaN layer.

The second conductive semiconductor layer 130 is formed on the active layer 120. The second conductive semiconductor layer 130 may include a compound semiconductor of group III-V elements doped with the second conductive dopant. For instance, the second conductive semiconductor layer 130 may be selected from the group consisting of GaN, AlN, AlGaN, InGaN, InN, InAlGaN, AlInN, AlGaAs, GaP, GaAs, GaAsP, and AlGaInP. If the second conductive semiconductor layer 130 is a P type semiconductor layer, the second conductive dopant is a P type dopant such as Mg or Ze. The second conductive semiconductor layer 130 may serve as an electrode contact layer, and may have a single-layer structure or a multi-layer structure, but the embodiment is not limited thereto.

The first conductive semiconductor layer 110, the active layer 120, and the second conductive semiconductor layer 130 may be defined as the light emitting structure 135. The first conductive semiconductor layer 110 may include a P type semiconductor, and the second conductive semiconductor layer 130 may include an N type semiconductor. A third conductive semiconductor layer such as an N type semiconductor layer or a P type semiconductor layer may be formed on the second conductive semiconductor layer 130. Accordingly, the light emitting structure 135 may include at least one of an N-P junction structure, a P-N junction structure, an N-P-N junction structure, and a P-N-P junction structure.

Figure 3:
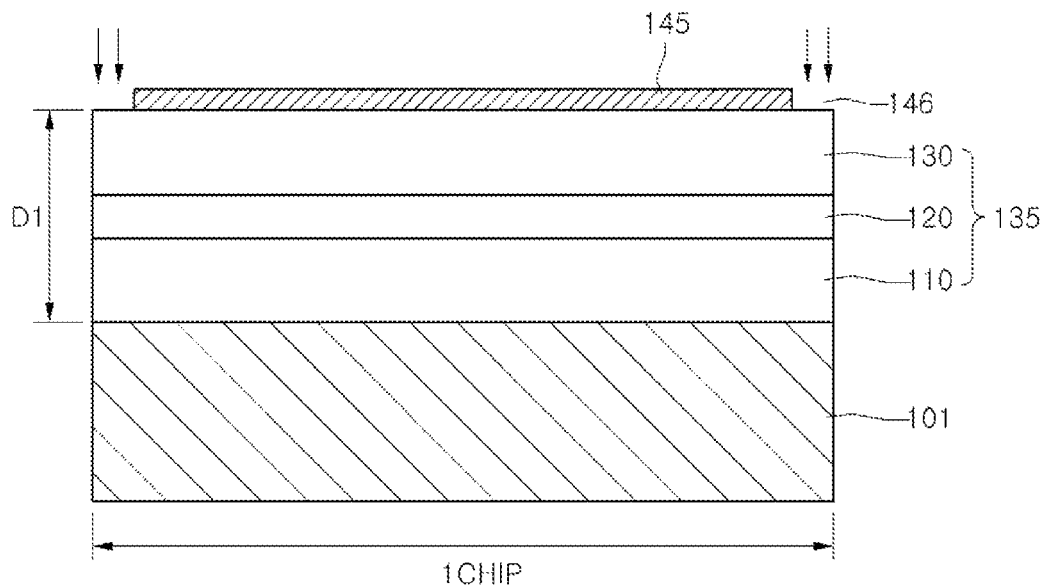
Figure 4:
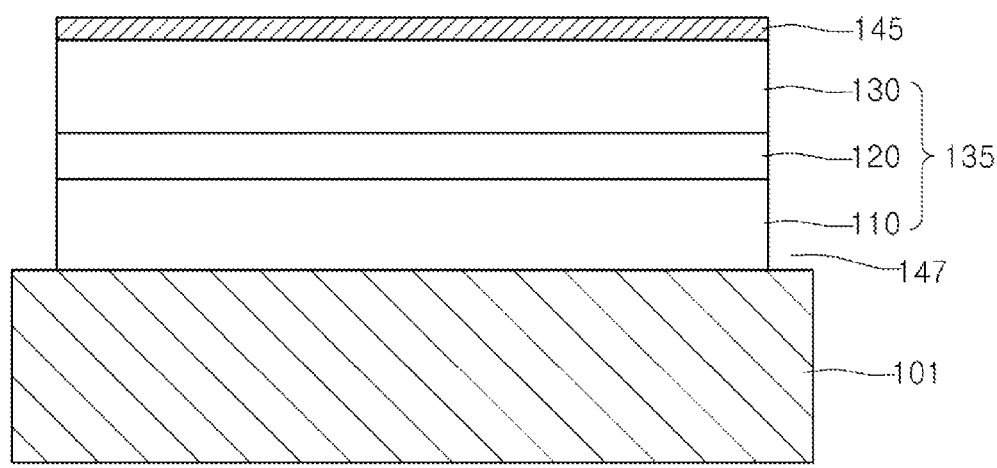

Referring to FIGS. 3 and 4, a mask layer 145 is formed on an inner region (light emission region) of the second conductive semiconductor layer 130.

The mask layer 145 is formed on the second conductive semiconductor layer 130 through a photolithography process, and an outer peripheral surface 146 of the second conductive semiconductor layer 130 may be etched in a predetermined mask pattern. Accordingly, the mask layer 145 is formed at the inner region of the second conductive semiconductor layer 130 except for the outer peripheral surface 146 of the second conductive semiconductor layer 130. To form the mask layer 145, various schemes may be used within the technical scope of the embodiment. However, the embodiment is not limited thereto.

A first mesa etching process may be performed with respect to the outer peripheral surface 146 of the second conductive semiconductor layer 130. The first mesa etching process may include a dry and/or wet etching process. Equipment for the dry etching process includes an ICP (Inductively Coupled Plasma), but the embodiment is not limited thereto.

The etching depth D1 of the first mesa etching process may correspond to a depth from the second conductive semiconductor layer 130 to a position in which the substrate 101 or the first conductive semiconductor layer 110 is exposed. The etching depth D1 of the first mesa etching process may be formed with respect to at least one of the semiconductor layers 130, 120, and 110 of the light emitting structure 135 or all of the semiconductor layers 130, 120, and 110.

Figure 5:
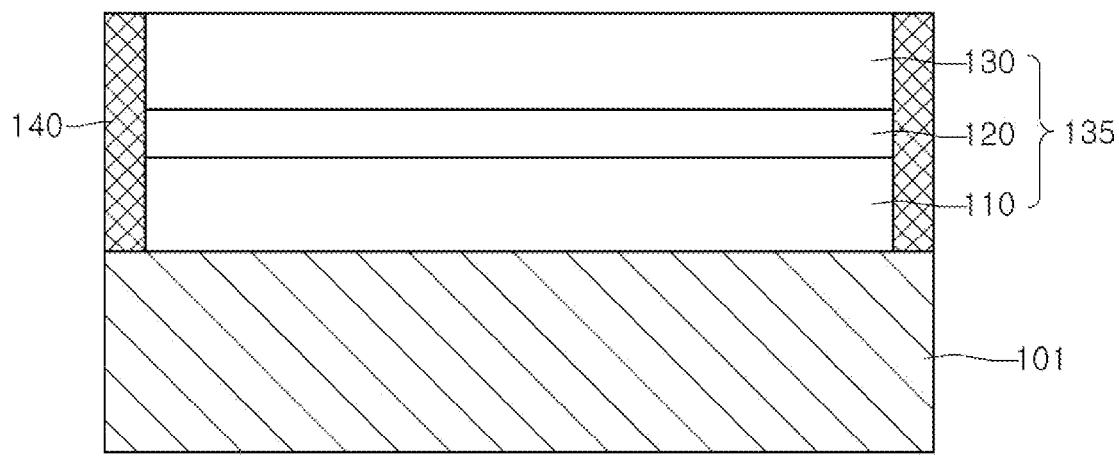

Referring to FIGS. 4 and 5, the insulating layer 140 is formed at a region 147 which has been formed through the first mesa etching process. The insulating layer 140 may include insulating material such as SiO2, Si3N4, Al2O3, or TiO2, but the embodiment is not limited thereto.

The insulating layer 140 is formed as a sidewall on the outer peripheral surface of the second conductive semiconductor layer 130, the active layer 120, and the first conductive semiconductor layer 110, and may be formed in the shape of a band or a ring.

The insulating layer 140 is provided at on the outer peripheral surface of the semiconductor layers 130, 120, and 110, thereby preventing residual material or external moisture from infiltrating into outer portions of the semiconductor layers 130, 120, and 110. Accordingly, electrical short can be prevented from occurring among the semiconductor layers 110, 120, and 130.

The upper end of the insulating layer 140 may protrude upward beyond the second conductive semiconductor layer 130. The insulating layer 140 may have a thickness less than or equal to that of the light emitting structure 135, or may have a thickness greater than or equal to that of the light emitting structure 135.

After the insulating layer 140 has been formed, the mask layer (see 145 of FIG. 3) is removed.

Figure 6:
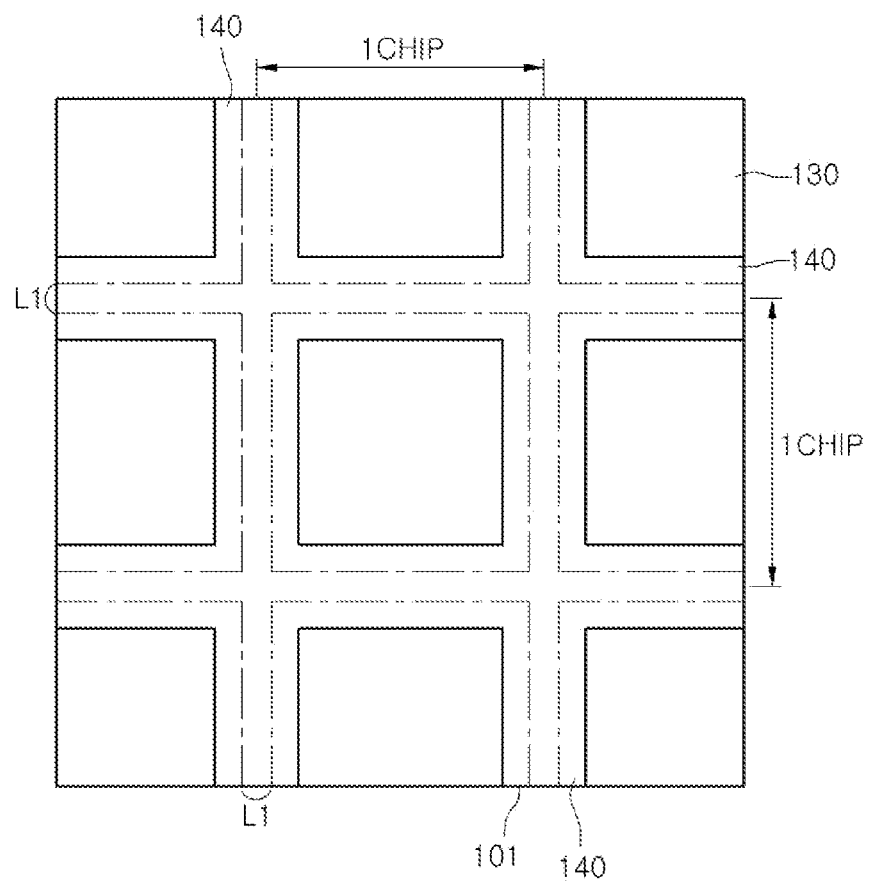

FIG. 6 is a plan view showing a plurality of chip regions. The insulating layer 140 may be formed in the shape of a polygonal band or ring on the outer peripheral surface of each chip. A central line L1 of the insulating layer 140 becomes a chip boundary region used to cut the substrate 101 in chip size.

Figure 7:
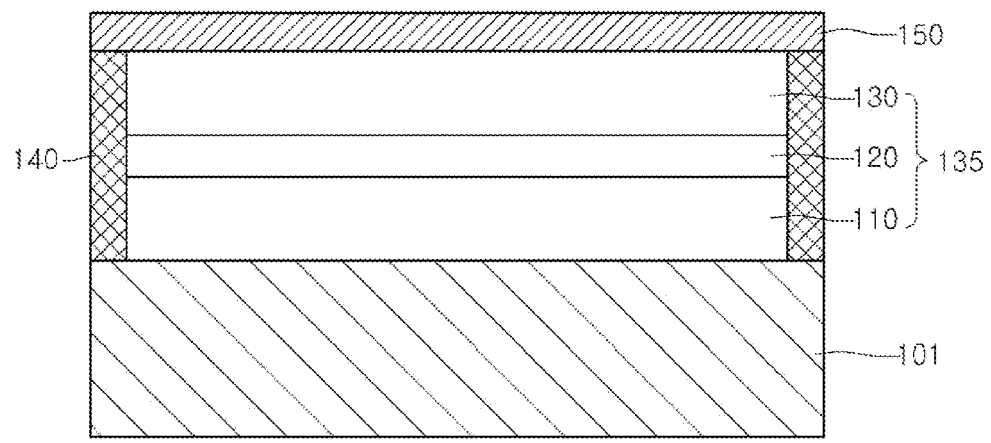

Referring to FIG. 7, the second electrode layer 150 is formed on the second conductive semiconductor layer 130. The second electrode layer 150 may be formed on the second conductive semiconductor layer 130, or may be formed on the second conductive semiconductor layer 130 and the insulating layer 140.

The second electrode layer 150 may include Ag, Ni, Al, Rh, Pd, Ir, Ru, Mg, Zn, Pt, Au, Hf, or the combination thereof. In this case, the second electrode layer 150 may include reflective electrode material having 50% or more of a reflective rate.

An ohmic contact layer (not shown) having a plurality of patterns arranged in the form of a matrix and/or a layer may be interposed between the second electrode layer 150 and the second conductive semiconductor layer 130. The ohmic contact layer includes at least one selected from the group consisting of ITO, IZO, AZO, IZTO, IAZO, IGZO, IGTO, and ATO.

The second electrode layer 150 may make schottky contact with the second conductive semiconductor layer 130 or may make ohmic contact with the second conductive semiconductor layer 130. If an ohmic contact layer having a pattern exists between the second electrode layer 150 and the second conductive semiconductor layer 130, the second electrode layer 150 makes schottky contact with the second conductive semiconductor layer 130, and the ohmic contact layer makes ohmic contact with the second conductive semiconductor layer 130. Accordingly, since the second electrode layer 150 has an electric characteristic different from that of the ohmic contact layer, current supplied to the second conductive semiconductor layer 130 can be diffused.

The second electrode layer 150 stably supplies power having the second polarity to the light emitting structure 135, and reflects light incident through the second conductive semiconductor layer 130.

Figure 8:
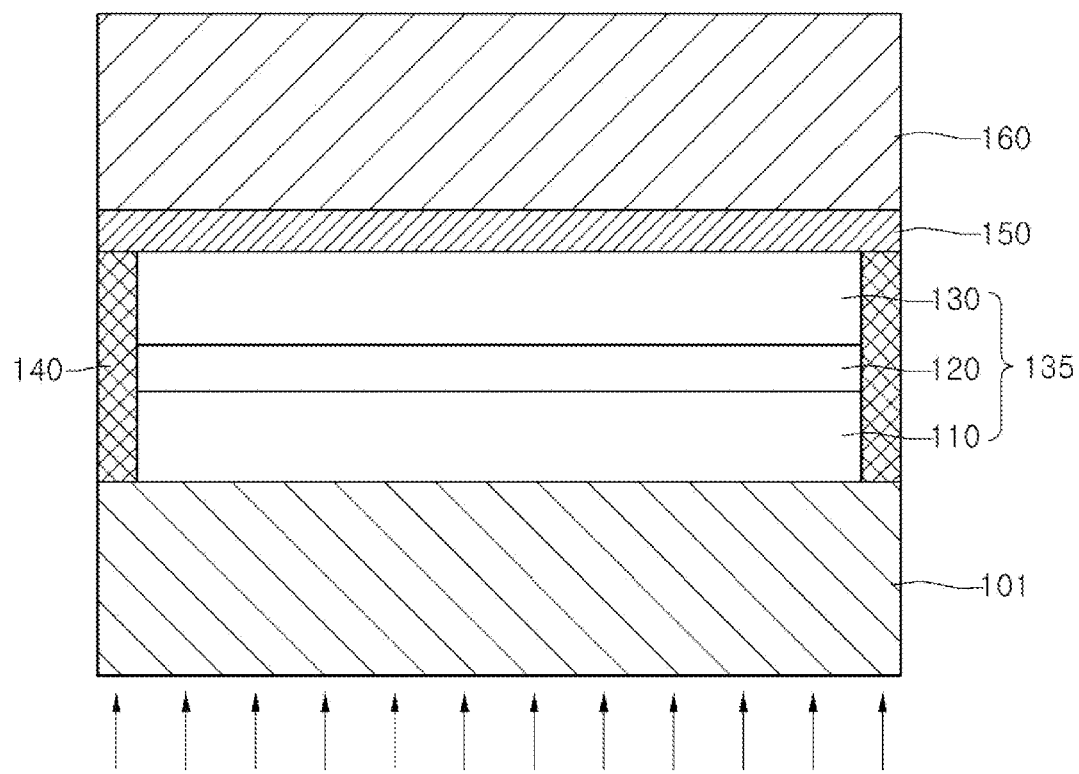

Referring to FIG. 8, the conductive support member 160 is formed on the second electrode layer 150. The second conductive support member 160 may be realized by using Cu, Au, Ni, Mo, Cu—W, and carrier wafers such as Si, Ge, GaAs, ZnO, and SiC. The conductive support member 160 may be formed through an electroplating process, but the embodiment is not limited thereto.

The second electrode layer 150 and the conductive support member 160 may be used as the second electrode part to supply power having the second polarity to the light emitting structure 135. The second electrode part may include electrode material having a single-layer structure or a multiple-layer structure, or may be bonded to a lower portion of the second conductive semiconductor layer 130 by using an adhesive agent.

When the conductive support member 160 has been formed, the resultant structure is turned over such that the substrate 101 is located at the uppermost layer and the conductive support member 160 serves as a base.

The substrate 101 is separated from the first conductive semiconductor layer 110 by irradiating a laser beam having a predetermined wavelength through the substrate 101. In other words, the substrate 101 may be removed through an LLO (Laser Lift Off) process. If another semiconductor layer (e.g., buffer layer) is formed between the substrate 101 and the first conductive semiconductor layer 110, the buffer layer is removed through a wet etching scheme, thereby separating the substrate 101 from the first conductive semiconductor layer 110. The substrate removing scheme is only one example, and the substrate 101 may be removed through various schemes.

In addition, the insulating layer 140 is provided at outer portions of the second conductive semiconductor layer 130 and the second electrode layer 150, so that adhesion strength between the second conductive semiconductor layer 130 and the second electrode layer 150 can be enhanced. Accordingly, the second conductive semiconductor layer 130 and the second electrode layer 150 can be protected from external impact. Therefore, the electrical reliability for the semiconductor light emitting device can be improved.

In addition, the insulating layer 140 can reduce impact caused by a laser beam when the laser beam is transmitted.

The surface of the first conductive semiconductor layer 110 without the substrate 101 may be polished through ICP/RIE (Inductively coupled Plasma/Reactive Ion Etching).

A roughness may be formed on the surface of the first conductive semiconductor layer 110.

Figure 9:
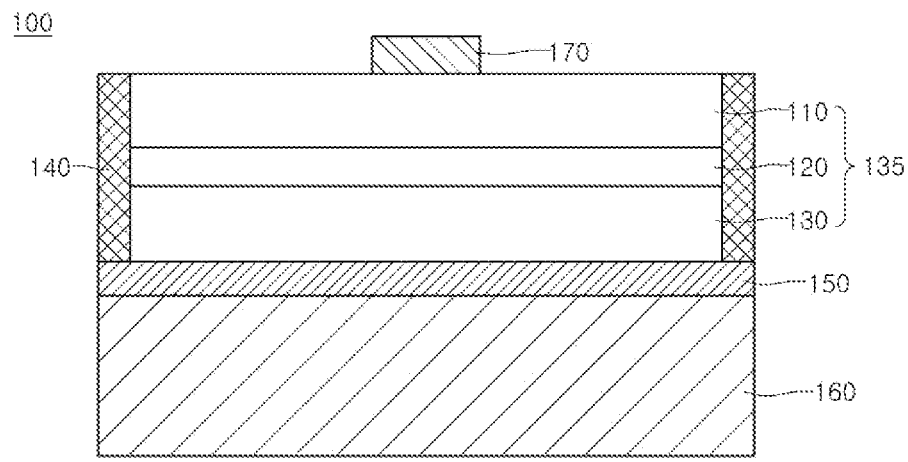

Referring to FIG. 9, the first electrode 170 is formed on the first conductive semiconductor layer 110.

In this case, a second mesa etching process is performed. The second mesa etching process is to etch the central portion of the insulating layer 140 provided on the outer peripheral surface of each chip. In other words, the second mesa etching process is performed along the chip boundary line L1 at a predetermined depth. The second mesa etching process may include a dry etching scheme or a wet etching scheme.

The first electrode 170 may be formed before or after the first mesa etching process is performed. Before the first electrode 170 is formed, a transmissive conductive layer (not shown) including ITO may be formed on the first conductive semiconductor layer 110. The transmissive conductive layer diffuses current supplied through the first electrode 170.

After the second mesa etching process has been performed, the structure is divided to an individual chip through a breaking process.

Since the insulating layer 140 is etched through the second mesa etching process, electrical short caused by the etching for the semiconductor material can be prevented. In other word, the stability of the manufacturing process can be improved. Accordingly, light emission efficiency can be improved by the ohmic characteristic of the insulating layer 140.

Since the insulating layer 140 has been formed, an additional insulating layer to protect an outer portion of the light emitting structure 135 from an external environment is omitted.

Figure 10:
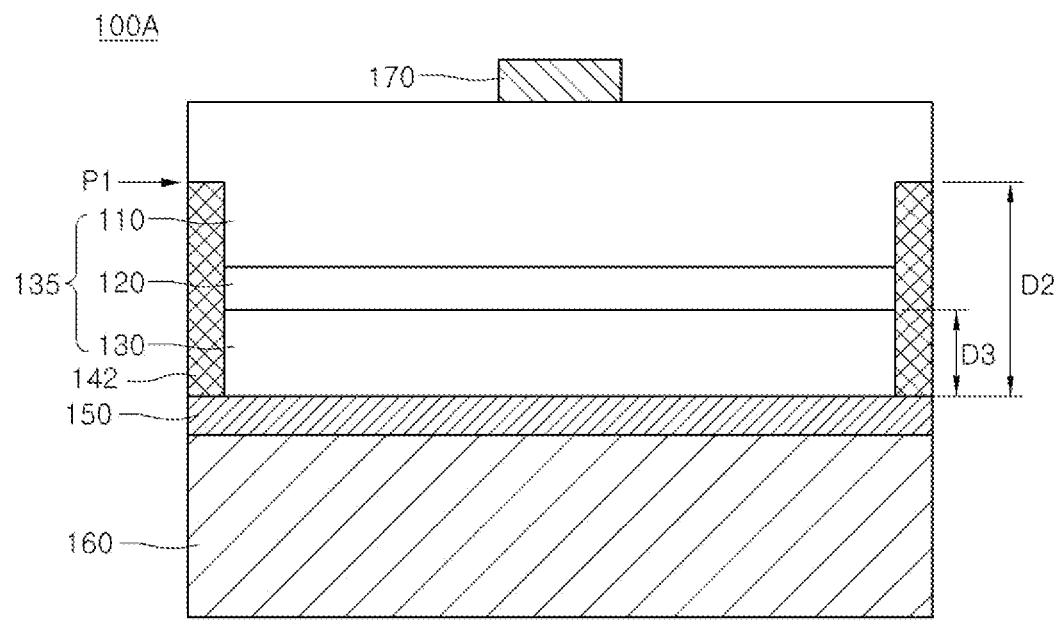
FIG. 10 is a side sectional view showing a semiconductor light emitting device according to a second embodiment.

FIG. 10 is a side sectional view showing a semiconductor light emitting device according to a second embodiment. Hereinafter, the second embodiment will be described while focusing on the difference from the first embodiment in order to avoid redundancy.

Referring to FIG. 10, a semiconductor light emitting device 100A includes an insulating layer 142 formed on an outer peripheral surface of the light emitting structure 135. The insulating layer 142 may be formed at a thickness D2 from the second conductive semiconductor layer 130 to a portion of the first conductive semiconductor layer 110. The insulating layer 142 can perform a function the same as that of the insulating layer 140 according to the first embodiment even if the insulating layer 142 is not formed over the whole area of an outer portion of the first conductive semiconductor layer 110.

A point P1 of an upper end of the insulating layer 142 may vary according to the etching depth of the first mesa etching process.

In addition, the insulating layer 142 may be formed at a thickness D3 less than or equal to that of the active layer 120. For example, the insulating layer 142 may be formed from the active layer 120 to the second conductive semiconductor layer 130 or the third conductive semiconductor layer (not shown).

In the semiconductor light emitting device 100A, the insulating layer 142 has material, a function, and an effect the same as those of the insulating layer 140 according to the first embodiment.

Figure 11:
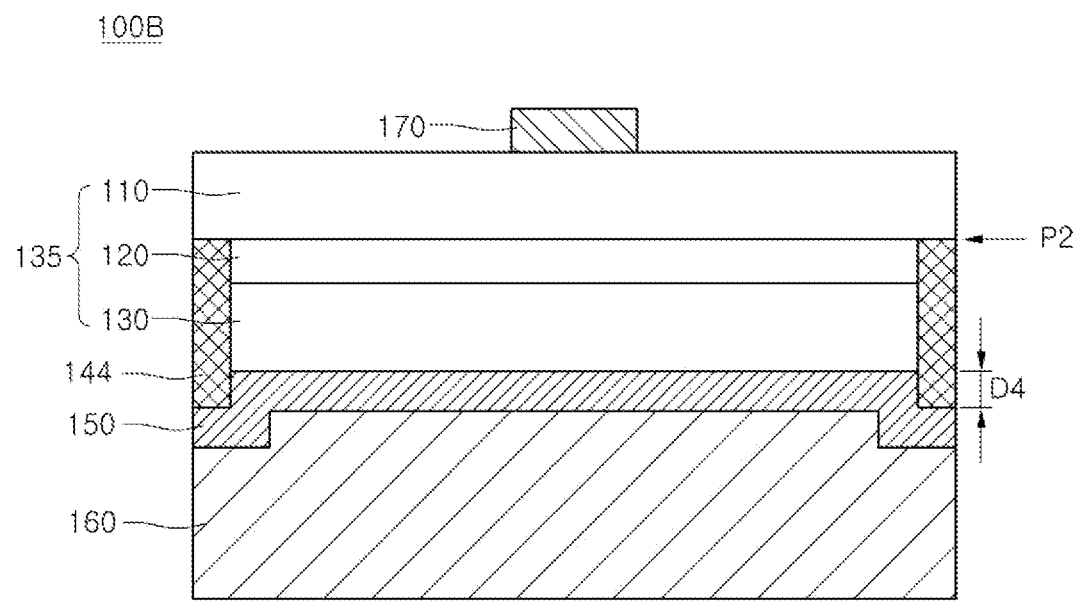
FIG. 11 is a side sectional view showing a semiconductor light emitting device according to a third embodiment.

FIG. 11 is a side sectional view showing a semiconductor light emitting device according to a third embodiment. Hereinafter, the third embodiment will be described while focusing on the difference from the first embodiment in order to avoid redundancy.

Referring to FIG. 11, the semiconductor light emitting device 100B includes an insulating layer 144 formed on an outer peripheral surface of the light emitting structure 135 and the second electrode layer 150.

The insulating layer 144 may be formed on an outer peripheral surface of the active layer 120, the second conductive semiconductor layer 130, and the second electrode layer 150.

The insulating layer 144 may protrude downward from the second conductive semiconductor layer 130 at a predetermined thickness D4, so that the insulating layer 144 may be provided at an outer portion of the second electrode layer 150.

The second electrode layer 150 may be formed under the second conductive semiconductor layer 130, or may be formed under both of the second conductive semiconductor layer 130 and the insulating layer 144.

Since the insulating layer 144 places the outer portion of the second electrode layer 150 at a lower position to more increase the distance between the second electrode layer 150 and the semiconductor layers 110, 120, and 130. The above structure can improve the electrical reliability for the semiconductor light emitting device 100B.

An upper end of the insulating layer 144 may extend to a portion of the first conductive semiconductor layer 110 or an upper end of the first conductive semiconductor layer 110, but the embodiment is not limited thereto.

In the semiconductor light emitting device 100B, the insulating layer 144 has material, a function, and an effect the same as those of the insulating layer 140 according to the first embodiment.

Figure 12:
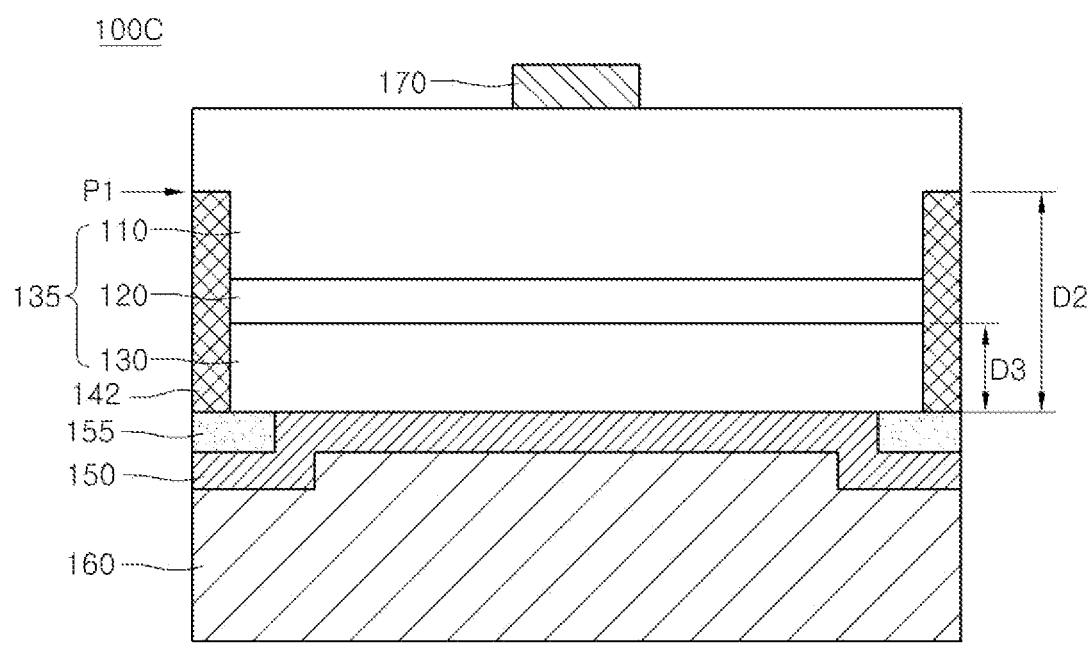
FIG. 12 is a side sectional view showing a semiconductor light emitting device according to a fourth embodiment.

FIG. 12 is a side sectional view showing a semiconductor light emitting device according to a fourth embodiment. Hereinafter, the fourth embodiment will be described while focusing on the difference from the first and second embodiments in order to avoid redundancy.

Referring to FIG. 12, a semiconductor light emitting device 100C includes the insulating layer 142 formed on an outer peripheral surface of the light emitting structure 135, and includes a passivation layer 155 formed on an outer peripheral surface of a top surface of the second electrode layer 150.

The passivation layer 155 may be formed in the shape of a band or a ring along an outer peripheral surface between the second electrode 150 and the insulating layer 142. The passivation layer 155 may make contact with an outer peripheral surface of a bottom surface of the second conductive semiconductor layer 130. If the passivation layer 155 includes conductive material, the electrical characteristic of the passivation layer 155 can be used.

In addition, the passivation layer 155 may include insulating material the same as that of the insulating layer 142 or may include a transmissive conductive layer. If the passivation layer 155 is the transmissive conductive layer, the passivation layer 155 may include ITO, IZO, AZO, IZTO, IAZO, IGZO, IGTO, or ATO.

Since the passivation layer 155 is formed at a chip boundary region, the passivation layer 155 can minimize the impact transferred to the light emitting structure 135 when the substrate is separated. If the passivation layer 155 is a transmissive conductive layer, the passivation layer 155 can reduce the width of the insulating layer 142 to increase the light emission area.

The technical characteristics of each embodiment are applicable to another embodiment, and are not limited to each embodiment.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Industrial Applicability

The embodiment can provide a semiconductor light emitting device such as an LED.

The embodiment can improve the reliability for the manufacturing process of the semiconductor light emitting device.

According to the embodiment, a light source formed by packaging the semiconductor light emitting device is applicable to various fields such as lighting, indicators, and displays.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
    a light emitting structure including a first semiconductor layer, a second semiconductor layer under the first semiconductor layer and an active layer between the first and second semiconductor layers;
    a first electrode on a top surface of the first semiconductor layer;
    a second electrode layer under a lower surface of the light emitting structure;
    a passivation layer between the light emitting structure and the second electrode layer;
    an insulating member between a lower surface of an protrusion of the first semiconductor layer and a top surface of the passivation layer; and
    a conductive support member under a lower surface of the second electrode layer,
    wherein the top surface of the passivation layer is contacted with a lower surface of the second semiconductor layer and a lower surface of the insulating member,
    wherein the insulating member surrounds side surfaces of the active layer and the second semiconductor layer,
    wherein the passivation layer includes an open area therein,
    wherein the second electrode layer includes an first portion disposed in the open area of the passivation layer and a second portion disposed under the lower surface of the passivation layer,
    wherein a top surface of the light emitting structure has a different width from the lower surface of the light emitting structure.

2. The light emitting device of claim 1, wherein the top surface of the light emitting structure has the width wider than that of the lower surface of the light emitting structure.

3. The light emitting device of claim 2, wherein the top surface of the first semiconductor layer has a width wider than that of a lower surface of the first semiconductor layer.

4. The light emitting device of claim 1, wherein the protrusion of the first semiconductor layer is located at a higher position than a lower surface of the first semiconductor layer and is located at an outer position than a side surface of the active layer.

5. The light emitting device of claim 1, wherein a top surface of the insulating member is located at a lower position than the protrusion of the first semiconductor layer and the insulating member is contacted with a side surface of a lower portion of the first semiconductor layer.

6. The light emitting device of claim 1, further comprising a contact layer contacted with the lower surface of the lower surface of the light emitting structure and a top surface of the second electrode layer,
    wherein the contact layer has a conductive material different from the second electrode layer.

7. The light emitting device of claim 1, wherein the passivation layer has an insulating material.

8. The light emitting device of claim 1, wherein the passivation layer has the same material as that of the insulating member.

9. The light emitting device of claim 1, wherein the passivation layer has the same material as that of the insulating member.

10. The light emitting device of claim 1, wherein the passivation layer is formed of a conductive material.

11. The light emitting device of claim 1, The light emitting device of claim 1, wherein the passivation layer is formed of a transmissive material.

12. The light emitting device of claim 1, wherein the conductive support member includes a protruding portion protruded toward the first portion of the second electrode layer.

13. A semiconductor light emitting device comprising:
    a light emitting structure including a first semiconductor layer, a second semiconductor layer under the first semiconductor layer and an active layer between the first and second semiconductor layers;
    a first electrode on a top surface of the first semiconductor layer;
    a second electrode layer under a lower surface of the light emitting structure;
    a first insulating layer between the light emitting structure and the second electrode layer;
    a second insulating layer between a part of side surface of the first semiconductor layer and a top surface of the first insulating layer; and
    a conductive support member under a lower surface of the second electrode layer,
    wherein the top surface of the first insulating layer is contacted with the lower surface of the light emitting structure and a lower surface of the second insulating layer,
    wherein the second insulating layer is contacted with side surfaces of the active layer and the second semiconductor layer,
    wherein the first insulating layer includes an open area therein,
    wherein the second electrode layer includes an first portion disposed in the open area of the first insulating layer and a second portion disposed under the lower surface of the first insulating layer,
    wherein the first insulating layer surrounds the first portion of the second electrode layer,
    wherein a top surface of the light emitting structure has a wider width than that of the lower surface of the light emitting structure.

14. The light emitting device of claim 13, wherein the second insulating layer has a thickness less than that of the light emitting structure.

15. The light emitting device of claim 13, wherein the first semiconductor layer has a multi-layer structure.

16. The light emitting device of claim 13, wherein a top surface of the second insulating layer is located at a lower position than the part of the side surface of the first semiconductor layer and the second insulating layer is contacted with the part of the side surface of the first semiconductor layer.

17. The light emitting device of claim 13, wherein an outer side surface of the first semiconductor layer and an outer side surface of the second insulating layer disposed on the same plane.

18. The light emitting device of claim 13, wherein the top surface of the first insulating layer has a width wider than that of the lower surface of the second insulating layer.

19. The light emitting device of claim 13, wherein the top surface of the first semiconductor layer has a width wider than that of a lower surface of the first semiconductor layer.

20. The light emitting device of claim 13, wherein the part of the side surface of the first semiconductor layer vertically overlaps the first and second the passivation layers.

* * * * *